United States Patent
Bauer et al.

(10) Patent No.: US 7,462,940 B2
(45) Date of Patent: Dec. 9, 2008

(54) SEMICONDUCTOR COMPONENT COMPRISING FLIP CHIP CONTACTS WITH POLYMER CORES AND METHOD OF PRODUCING THE SAME

(75) Inventors: Michael Bauer, Nittendorf (DE); Alfred Haimerl, Sinzing (DE); Angela Kessler, Regensburg (DE); Joachim Mahler, Regensburg (DE); Wolfgang Schober, Amberg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/620,784

(22) Filed: Jan. 8, 2007

(65) Prior Publication Data

US 2007/0182021 A1    Aug. 9, 2007

(30) Foreign Application Priority Data

Jan. 11, 2006    (DE) .................. 10 2006 001 600

(51) Int. Cl.
  *H01L 23/50* (2006.01)
  *H01L 23/48* (2006.01)
  *H01L 23/498* (2006.01)
  *H01L 21/00* (2006.01)

(52) U.S. Cl. .................. 257/778; 257/E23.021; 257/E23.008; 257/E21.503; 257/E23.004; 257/E23.069; 257/734; 257/737; 257/738; 257/692; 257/693; 257/772; 257/779; 438/108

(58) Field of Classification Search .................. 257/778, 257/E23.021, E23.008, E21.503, E23.004, 257/E23.069, E23.068, 734, 737, 738, 692, 257/700, 693, 701, 772, 779; 438/108
See application file for complete search history.

(56) References Cited

U.S. PATENT DOCUMENTS

| 5,971,253 | A | 10/1999 | Gilleo et al. |
| 6,073,829 | A | 6/2000 | Pienimaa |
| 6,337,445 | B1 | 1/2002 | Abbott et al. |
| 6,680,128 | B2 * | 1/2004 | Mei .................. 428/570 |

(Continued)

FOREIGN PATENT DOCUMENTS

DE    102006001600 B3 *    8/2007

(Continued)

OTHER PUBLICATIONS

U.S. Appl. No. 11/520,035 (Bauer et al.), filed Sep. 13, 2006 (Not yet published).

(Continued)

*Primary Examiner*—Alexander O Williams
(74) *Attorney, Agent, or Firm*—Edell, Shapiro & Finnan, LLC

(57) ABSTRACT

A semiconductor component includes flip-chip contacts arranged on a wiring structure of a semiconductor chip. The wiring structure includes at least one metallization layer and at least one dielectric insulation layer made of a low-k material with a relative permittivity $\epsilon_r$ lower than the relative permittivity of a silicon dioxide. The flip-chip contacts are arranged on contact areas of an upper metallization layer and have a polymer core surrounded by a lead-free solder sheath.

15 Claims, 3 Drawing Sheets

U.S. PATENT DOCUMENTS

| | | | |
|---|---|---|---|
| 6,826,037 B2 * | 11/2004 | Hedler et al. | 361/679 |
| 6,906,427 B2 * | 6/2005 | Tanaka et al. | 257/778 |
| 7,207,878 B2 * | 4/2007 | Hu et al. | 451/526 |
| 7,312,533 B2 * | 12/2007 | Haimerl et al. | 257/779 |
| 2003/0042620 A1 | 3/2003 | Hedler et al. | |
| 2003/0202332 A1 | 10/2003 | Reinikainen et al. | |
| 2004/0253803 A1 * | 12/2004 | Tomono et al. | 438/614 |
| 2005/0239295 A1 * | 10/2005 | Wang et al. | 438/780 |
| 2005/0266668 A1 * | 12/2005 | Sawada et al. | 438/612 |
| 2006/0151870 A1 * | 7/2006 | Nishiyama et al. | 257/700 |
| 2007/0120268 A1 * | 5/2007 | Irsigler et al. | 257/778 |

FOREIGN PATENT DOCUMENTS

| | | | |
|---|---|---|---|
| EP | 0977253 A2 | | 2/2000 |
| JP | 5-144823 | * | 6/1993 |
| JP | 8213400 | | 8/1996 |

OTHER PUBLICATIONS

Amkor Technology, "Flip Chip Packaging of Low K Devices.".

Emery, R., et al., "Novel Microelectronic Packaging Method for Reduced Thermomechanical Stresses on Low Dielectric Constant Materials," Advanced Metallization Conference, Montreal, Canada, Oct. 9, 2001.

Hotchkiss, Greg et al., Addressing Packaging Concerns of Low-k Silicon, EETimes.com, Feb. 11, 2004.

Klein, M., et al., "A Characterisation of Plastic Core Solder Balls for BGA and Flip Chip Applications," IMAPS Nordic Conference, Stockholm, Sweden, Sep. 30-Oct. 2, 2002.

Micropearl SOL (Conductive Fine Particles) Composition and Product Line Up, Sekisui SS Project, Sekisui Chemical Co., Ltd., Copyright 2001.

* cited by examiner

SEMICONDUCTOR COMPONENT COMPRISING FLIP CHIP CONTACTS WITH POLYMER CORES AND METHOD OF PRODUCING THE SAME

CROSS REFERENCE TO RELATED APPLICATIONS

This application claims priority under 35 U.S.C. §119 to Application No. DE 102006001600.9 filed on Jan. 11, 2006, entitled "Semiconductor Component Comprising Flip-Chip Contacts and Method for Producing the Same," the entire contents of which are hereby incorporated by reference.

BACKGROUND

Semiconductor components comprising flip-chip contacts are subject to new problems as a result of the development of new electrical materials for semiconductor wafers. These so-called "low-k materials" enable insulation thicknesses of less than 100 nanometers on semiconductor wafers having a diameter of 300 millimeters. Compared with the traditional thermal gate oxides, the new materials, on account of their extremely low dielectric constant, which is lower than the dielectric constant of silicon dioxide, are able to realize even thinner gate dielectrics for the same dielectric strength, with the result that improved properties become possible for semiconductor components of this type. Layer sequences for wiring structures on semiconductor chips can also be produced more compactly with low-k materials.

One disadvantage of these semiconductor components with insulation layers of "low-k material" however, is that the risk of delamination of such layers under thermal loading is significantly higher than in the case of the conventional insulation layers made of thermal silicon oxide and/or silicon nitride layers on silicon semiconductor wafers. In addition to the risk of delamination, while these new materials are softer and more spongy or more porous than previous insulation materials, they exhibit an increased brittleness that reduces the possibility of stress loading after a breaking loading.

The problems with new "low-k" insulation materials are also exacerbated by the environmental protection requirements for avoiding soft lead-containing solder materials for flip-chip contacts and replacing the solder materials by harder, lead-free solders whose flow temperature of 210° C. to 250° C. is significantly higher than in the case of the previously-used flip-chip contacts made of lead-containing solder materials, which undergo transition to the flow state at a temperature as low as 150°. Attempts to compensate for the increased risk of delamination and breaking of the new insulation layer materials by means of underfill materials that are arranged between a semiconductor chip with flip-chip contacts and a circuit substrate and have a reduced modulus of elasticity have not, however, heretofore achieved the desired success and the desirable reliability for flip-chip contacts made of lead-free solder material.

The problems that occur with conventional components comprising flip-chip contacts are illustrated by FIGS. 7 to 9. In this respect, FIG. 7 shows a schematic cross section through a semiconductor component comprising flip-chip contacts of conventional design, at temperatures below room temperature. FIG. 8 shows a schematic cross section through the semiconductor component in accordance with FIG. 7 at room temperature. FIG. 9 shows a schematic cross section through the semiconductor component in accordance with FIG. 8 above room temperature.

At temperatures below room temperature, as shown in FIG. 7, warping occurs in the case of conventional semiconductor components 10 on account of the different coefficients of thermal expansion of the semiconductor chip 4 and of the wiring substrate 12. The warping can be compensated for only in part by means of an underfill material 17 in the interspace 16 having a high modulus of elasticity. At room temperature, by contrast, the thermal strains are low, with the result that warping effects and shear stresses are minimized, as shown in FIG. 8. At temperatures above room temperature, the wiring substrate 12 expands to a greater extent than the semiconductor chip 4, with the result that the flip-chip contacts 2 are subjected to shear stress, and warping can also occur despite the underfill material 17.

SUMMARY

Described herein is a semiconductor component comprising flip-chip contacts, and a method for producing the same, which utilizes the advantages of the low relative permittivity of the new "low-k material" and at the same time reduces the risk of delamination during the application of flip-chip contacts made of lead-free solder to corresponding wiring substrates and increases the reliability of semiconductor components of this type.

In particular, a semiconductor component comprises: a semiconductor chip comprising a wiring structure including at least one metallization layer with contact areas and at least one dielectric insulation layer comprising a low-k material having a relative permittivity $\epsilon_r$ that is lower than the relative permittivity of a silicon oxide; and flip-chip contacts arranged on the contact areas of the metallization layer, the flip-chip contacts comprising a polymer core surrounded by a lead-free solder material.

The above and still further features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The invention will be explained in more detail with reference to the accompanying figures.

DETAILED DESCRIPTION

Figure 1:
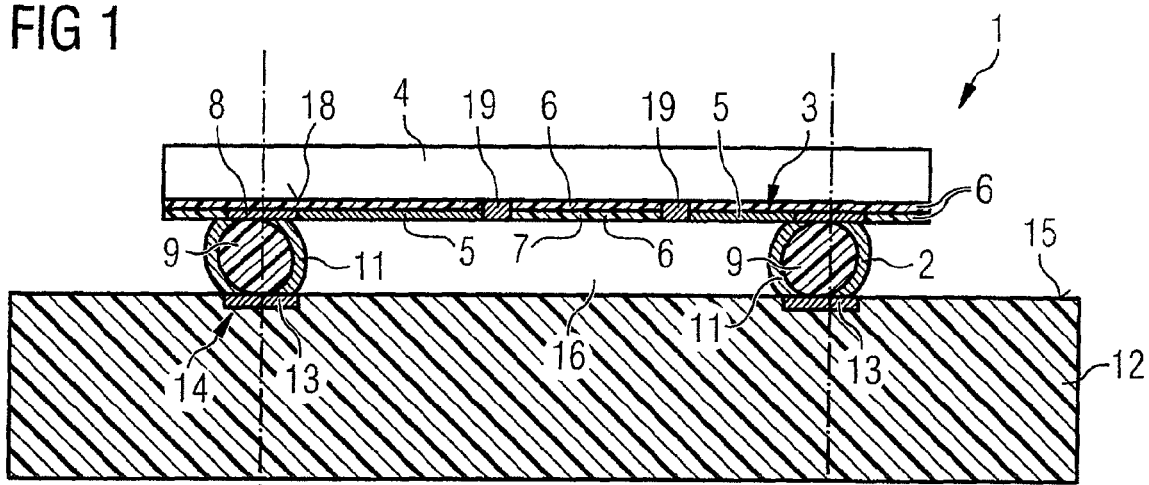
FIG. 1 shows a schematic cross section through a semiconductor component of a first embodiment of the invention, at a reduced temperature below room temperature.

A semiconductor component comprises flip-chip contacts on a wiring structure of a semiconductor chip, the wiring structure having metallization layers and, arranged therebetween, dielectric insulation layers made of a so-called "low-k material" the relative permittivity $\epsilon_r$ of which is lower than the relative permittivity of a silicon oxide. In this respect, the semiconductor component has flip-chip contacts on contact areas of an upper metallization layer which have a polymer core surrounded by a lead-free solder material.

This semiconductor component has the advantage that stress loadings due to different coefficients of expansion of the semiconductor chip material and of the wiring substrate are compensated for without the metallization layers and the dielectric insulation layers made of a "low-k material" arranged in between being loaded in such a way that delaminations and/or microcracks occur in the insulation layers.

For this purpose, use is made of a polymer core having a low modulus of elasticity and additionally having a low glass transition temperature and thus a low softening temperature. The compliance of such flip-chip contacts made of a polymer core with a metallic coating made of lead-free solder material is improved compared with the compliance of flip-chip contacts made of lead-containing solder material in such a way that the stress loading in the event of thermal cycling is significantly reduced, with the result that the previously occurring risk of delamination of the new insulation material from the silicon semiconductor material is reduced.

Preferably, copper oleates, aluminum oleates, or so-called black diamond and also preferably porous $SiO_2$ may be used as "low-k materials." The oleates are organometallic compounds having a relative permittivity $\epsilon_r$ of less than 3.0.

In one preferred embodiment of the invention, the "low-k material" has a coefficient of thermal expansion that is lower than the coefficient of thermal expansion of conventional insulation materials. Moreover, it is advantageous for the "low-k material" to have a higher ductility than conventional insulation materials. However, the higher ductility also means a greater sensitivity with respect to the propagation of microcracks in the new insulation layer material.

In order to adapt the properties and the compliance of the flip-chip contacts to this sensitive insulation material, a polymer core made of silicones is used for the flip-chip contacts. However, polymer cores made of thermoplastics or made of elastomers are also advantageous. For this purpose, the polymer core may have a ball form (substantially spheroid) such as is currently commercially available, or the polymer cores may be embodied in bump form such as is currently used in the case of elastic contacts for BGA housings.

Preferably, the flip-chip contacts are internal connecting elements of the semiconductor component to a wiring substrate, flip-chip contacts being fixed by their outer sheath made of lead-free solder on contact pads of a wiring structure on the top side of a wiring substrate of the semiconductor component. This embodiment of the invention does not provide for filling the interspace between the semiconductor chip and the wiring substrate via an underfill material, especially as the compliant flip-chip contacts having a polymer core can now be deformed freely and compliantly.

However, if an underfill material is required in order to prevent cavities from arising in the semiconductor component, then use is preferably made of an underfill material having a lower modulus of elasticity than previous underfill materials and a lower glass transition temperature than conventional underfill materials. What is achieved thereby is that the compliance of the flip-chip contacts is further supported and not prevented by the underfill material.

A method for producing a semiconductor component comprising flip-chip contacts includes the following operations. The first operation involves producing semiconductor chips with a wiring structure having metallization layers and, arranged therebetween, dielectric insulation layers made of a so-called "low-k material", the relative permittivity $\epsilon_r$ of which is lower than the relative permittivity of a silicon dioxide. In this case, the upper metallization layer has contact areas for flip-chip contacts. In a further operation, flip-chip contacts are applied to the contact areas, the flip-chip contacts having a polymer core surrounded by a lead-free solder material. This application is effected at flow temperatures of the lead-free solder material within the range of 210 to 250° C.

Nevertheless, warping do not occur during the cooling process after the flip-chip contacts have been soldered onto the internal wiring substrate of the semiconductor component, especially as the flip-chip contacts with their polymeric core are so compliant that the risk of delamination between the silicon semiconductor material and the insulation layer made of "high-k material" having a thickness of only a few tens of nanometers is reduced.

After the flip-chip contacts of the semiconductor chip have been soldered onto a wiring substrate of the semiconductor component, it is preferably possible for the interspace between the semiconductor chip with flip-chip contacts and the top side of the wiring substrate to be filled with an underfill material, the modulus of elasticity of which and the glass transition temperature of which are lower than the modulus of elasticity and the glass transition temperature of conventional underfill materials.

To summarize, the described semiconductor component provides the following advantages. The modulus of elasticity is reduced due to polymer-containing flip-chip contacts, which enable a more flexible behavior and a resilient absorption of the loadings that occur. An adaptation of the coefficients of expansion of semiconductor chips, flip-chip contacts, and wiring substrate results in a reduction of thermal stresses in the event of thermal cycling. No process changes are required for the production of the semiconductor component, so that the solder ball application and the processing can be effected under standard conditions. By adapting the properties of the flip-chip contacts, it is possible to choose improved underfill materials with regard to the reliability for the semiconductor component by using underfill materials having a low modulus of elasticity and a low glass transition temperature.

Exemplary embodiments of the invention are described in connection with the accompanying drawings. FIG. 1 shows a schematic cross section through a semiconductor component 1 of a first embodiment of the invention, at a reduced temperature below room temperature. In this respect, the semiconductor component 1 comprises a semiconductor chip 4 arranged on a wiring substrate 12. The semiconductor chip 4 has electrodes 19 of an integrated circuit on its active top side 18. The electrodes 19 are connected to the flip-chip contacts 2 via a wiring structure 3 of the semiconductor chip 4 and contact areas 8. For this purpose, the wiring structure 3 has a metal layer 5 and insulation layers 6 which are constructed from a "low-k material" 7.

A "low-k material" 7 of this type is distinguished by a low dielectric constant lying below the dielectric constant of conventional thermal silicon dioxide. Materials of this type may have copper oleate or aluminum oleate or black diamond material or preferably porous $SiO_2$. These materials are distinguished by a higher ductility, but have the disadvantage that there is the risk of delamination between the top side 18 of the silicon chip 4 and the insulation layer 6 made of "low-k material". Particularly when the semiconductor component 1, as shown in FIG. 1, is exposed to a reduced temperature relative to room temperature.

Figure 7:
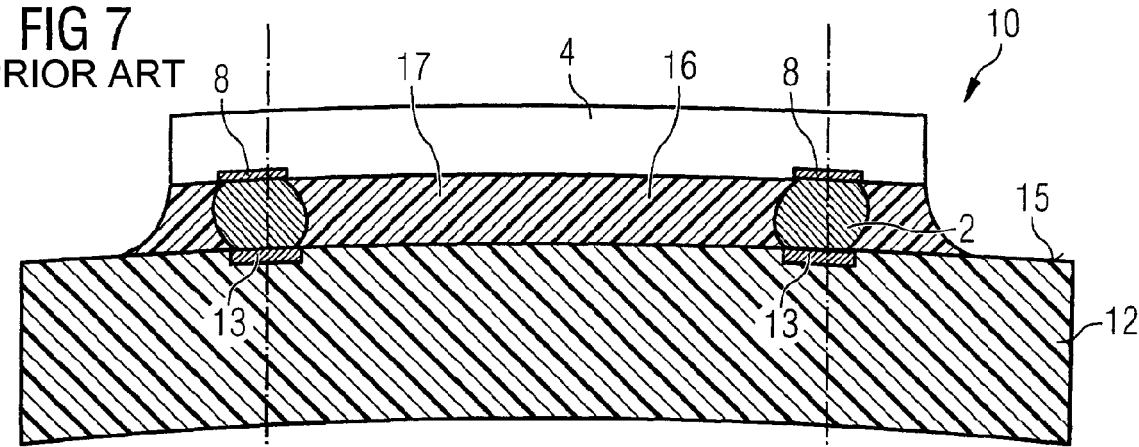
FIG. 7 shows a schematic cross section through a semiconductor component comprising flip-chip contacts of conventional design, at temperatures below room temperature.
Figure 8:
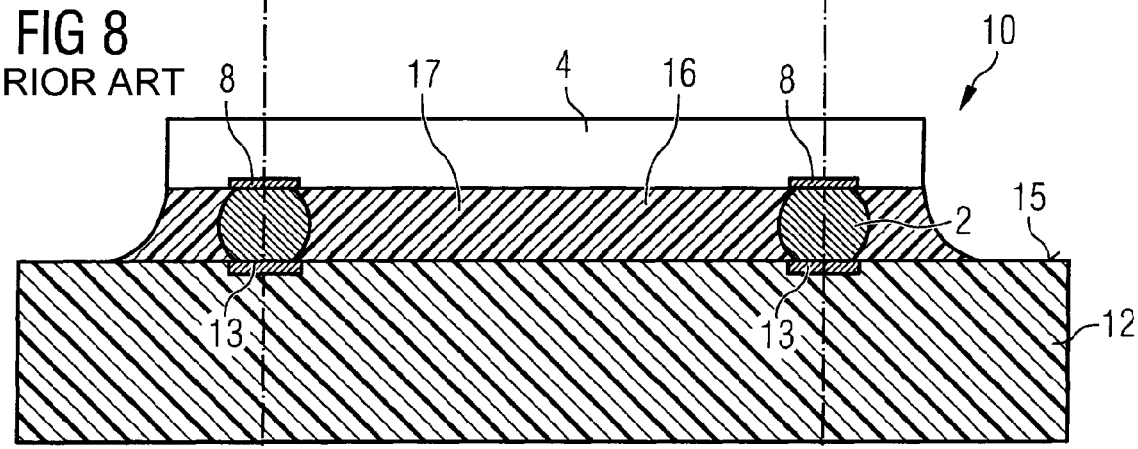
FIG. 8 shows a schematic cross section through the semiconductor component in accordance with FIG. 7 at room temperature.
Figure 9:
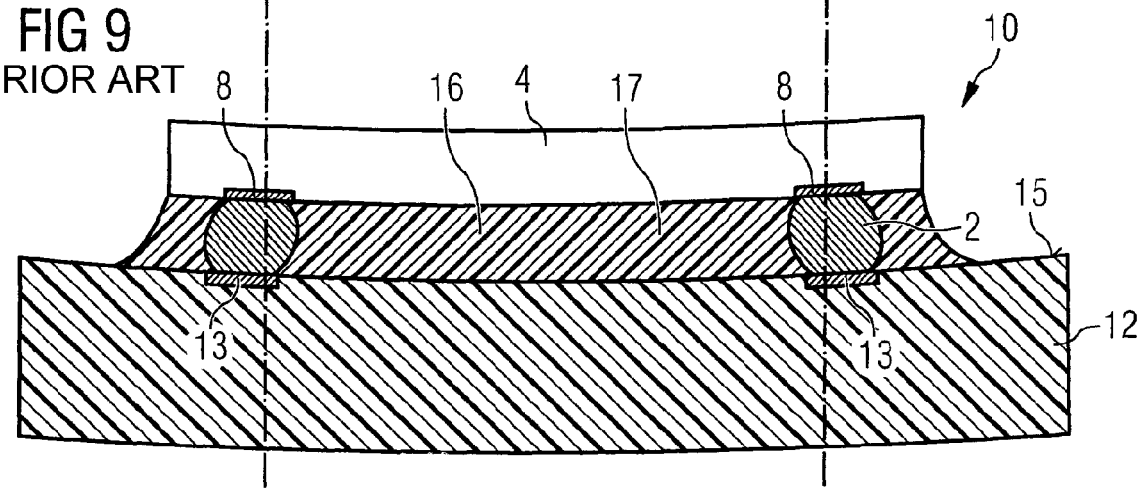
FIG. 9 shows a schematic cross section through a semiconductor component in accordance with FIG. 8 above room temperature.

On account of the different coefficients of thermal expansion of the semiconductor chip 4 and of the wiring substrate 12, on which the semiconductor chip 4 is fixed by means of its flip-chip contacts 2 on corresponding contact pads 13 of a wiring structure 14 of the top side 15 of the wiring substrate 12, the wiring substrate 12 shrinks to a greater extent than the semiconductor chip 4. Whereas, in a conventional semiconductor component 10 as shown in FIG. 7 in accordance with the prior art, a warping then occurs on account of the thermal loading, this is not the case for the embodiment of the invention shown here since the flip-chip contacts 2 comprise a polymer core 9 and a casing made of lead-free solder material 11, with the result that the compliance of the flip-chip contacts 2 is significantly improved compared with solid flip-chip contacts made of lead-free material. This also has the effect of reducing the risk of delamination of the insulation layers 6 on the semiconductor chip 4 and avoiding a warping of the semiconductor component 1.

Figure 2:
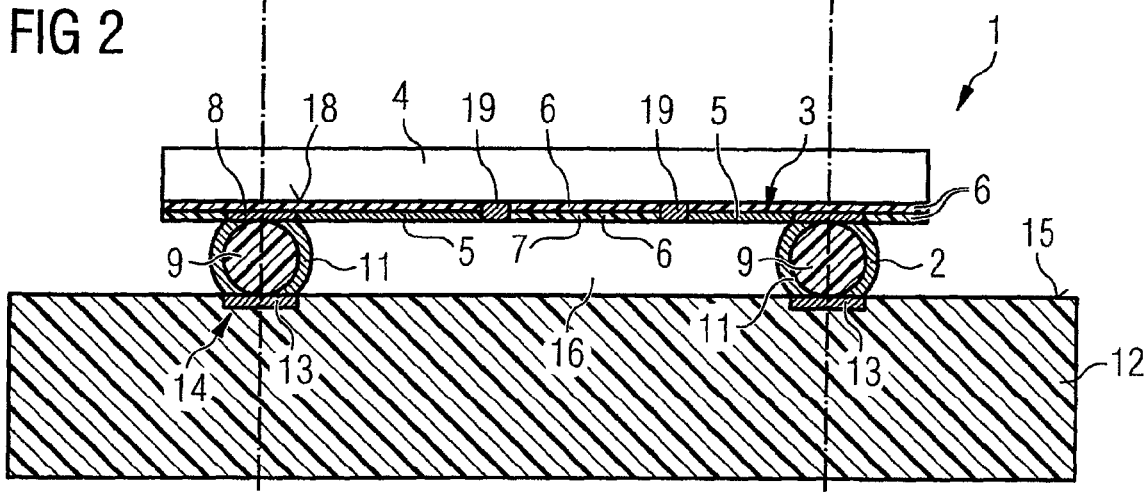
FIG. 2 shows a schematic cross section through the semiconductor component at room temperature.

FIG. 2 shows a schematic cross section through the semiconductor component in accordance with FIG. 1 at room temperature. Components having functions identical to those in FIG. 1 are identified by identical reference symbols and are not discussed separately. At room temperature, the thermal loadings are compensated for to the greatest possible extent, so that the compliant flip-chip contacts 2 are not deformed, but rather remain in a neutral position.

Figure 3:
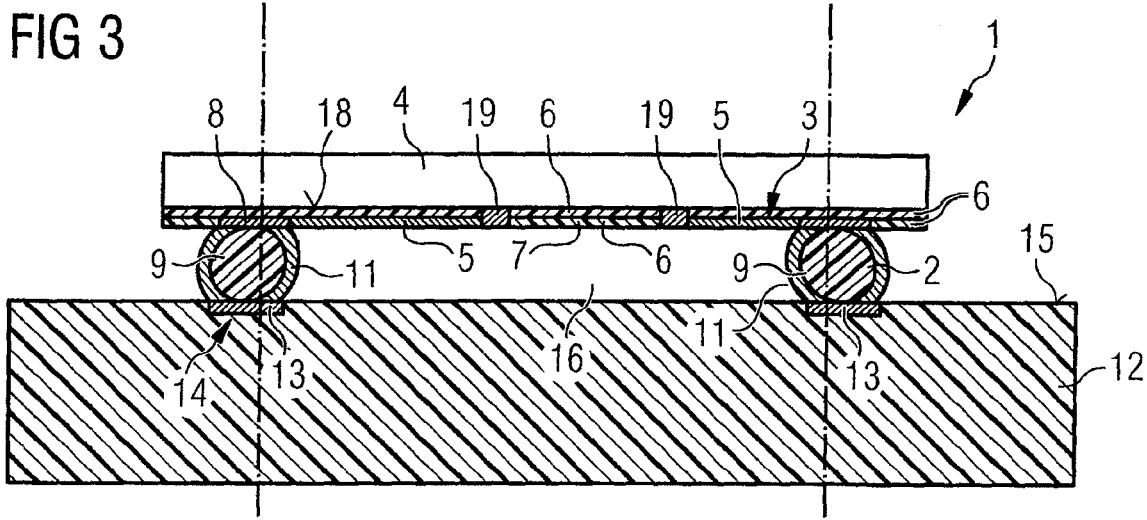
FIG. 3 shows a schematic cross section through the semiconductor component in accordance with FIG. 2 at an elevated temperature above room temperature.

FIG. 3 shows a schematic cross section through the semiconductor component in accordance with FIG. 2, at elevated temperature above room temperature. At elevated temperatures, on account of the greater coefficient of expansion, the substrate 12 expands to a greater extent compared with the semiconductor chip 4, with the result that the compliant flip-chip contacts with their polymer core having a low modulus of elasticity follow the expansion behavior of the wiring substrate 12 without loading the insulation layers made of "low-k material" on the top side 18 of the semiconductor chip 4.

Figure 4:
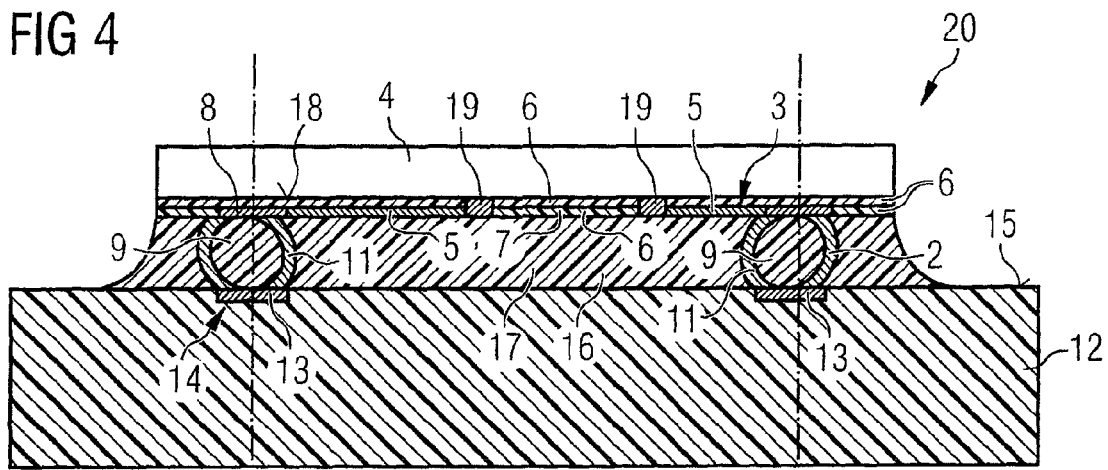
FIG. 4 shows a schematic cross section through a semiconductor component in accordance with a second embodiment of the invention at a reduced temperature below room temperature.

FIG. 4 shows a schematic cross section through a semiconductor component 20 in accordance with a second embodiment of the invention, at reduced temperature below room temperature. Components having functions identical to those in the previous figures are identified by identical reference symbols and are not discussed separately. The difference between the first embodiment of the invention in accordance with FIGS. 1 to 3 and the second embodiment of the invention in accordance with FIGS. 4 to 6 is that, in order to support the compliant flip-chip contacts 2, an underfill material 17 fills the interspace 16 between the semiconductor chip 4 and the top side 15 of the wiring substrate 12.

The underfill material 17 is introduced into the interspace 16 via capillary action and is characterized by the fact that it has a lower modulus of elasticity and a lower glass transition temperature than conventional underfill materials. On account of these properties of the underfill material, the compliance of the flip-chip contacts 2 is supported without a warping of the wiring substrate 12 occurring at reduced temperatures, or without increased loadings of the insulation layer 6 made of "low-k material" 7 that is at risk of delamination occurring in the boundary region between the top side 18 of the semiconductor chip 4 and the insulation layer 6. Only the underfill material 17 and the elastic flip-chip contacts 2 follow the greater shrinkage of the wiring substrate 12.

Figure 5:
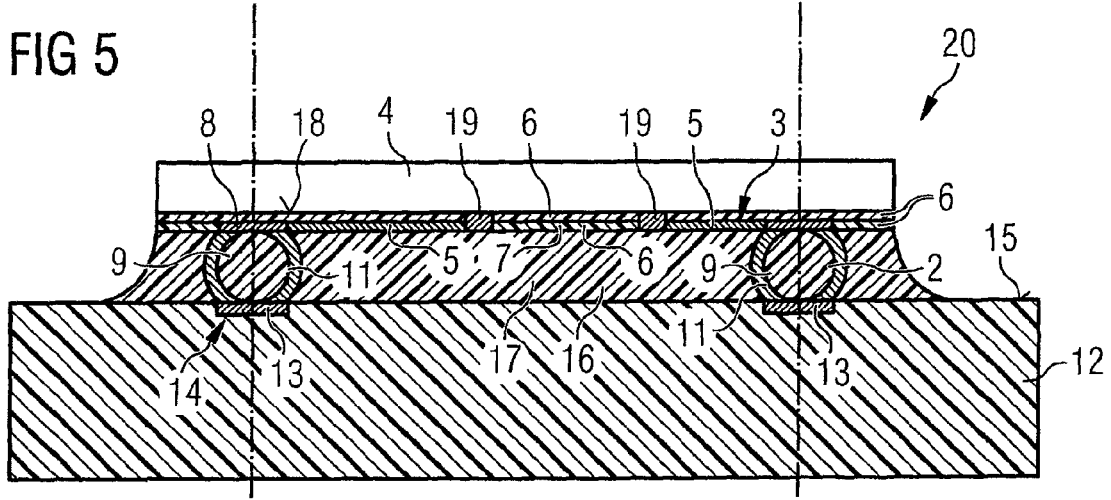
FIG. 5 shows a schematic cross section through the semiconductor component in accordance with FIG. 4 at room temperature.

FIG. 5 shows a schematic section through the semiconductor component 20 in accordance with FIG. 4 at room temperature. At room temperature, the thermal stresses are compensated for to the greatest possible extent, so that the flip-chip contacts 2 assume a neutral position and the underfill material 17 is also present in an undeformed manner.

Figure 6:
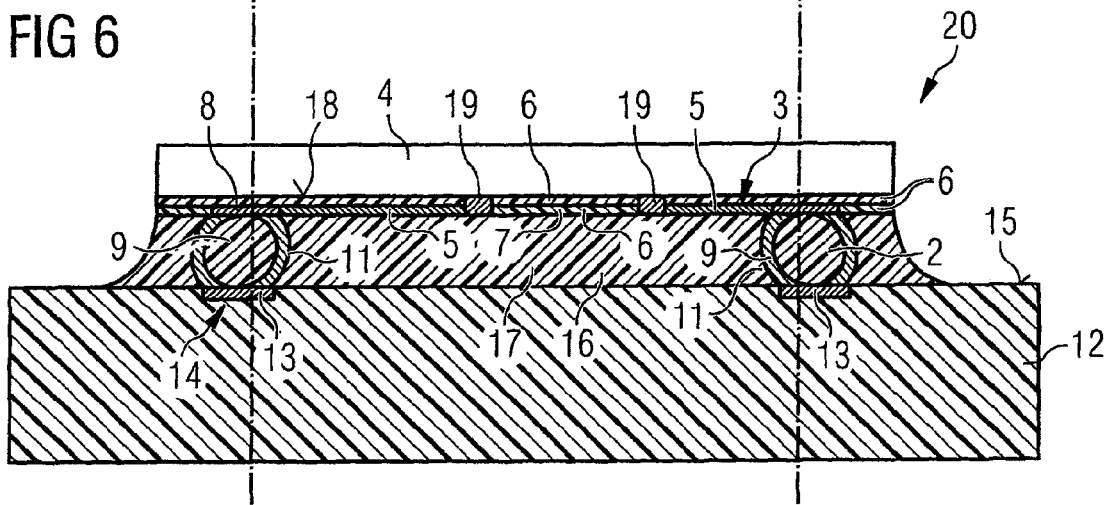
FIG. 6 shows a schematic cross section through the semiconductor component in accordance with FIG. 5 at an elevated temperature above room temperature.

FIG. 6 shows a schematic cross section through the semiconductor component 20 in accordance with FIG. 5, at elevated temperature above room temperature. In this case, the wiring substrate 12 expands to a greater extent than the semiconductor chip 4, so that the compliant flip-chip contacts 2 with their polymer core 9 are deformed together with the underfill material 17 without constituting an excessively increased loading for the sensitive insulation layers made of "low-k material" 7.

Having described preferred embodiments of the invention, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in a generic and descriptive sense only and not for purposes of limitation.

What is claimed is:

1. A semiconductor component, comprising:
   a semiconductor chip comprising a wiring structure including at least one metallization layer with contact areas and at least one dielectric insulation layer comprising a low-k material having a relative permittivity $\epsilon_r$ that is lower than the relative permittivity of a silicon oxide; and
   flip-chip contacts arranged on the contact areas of the metallization layer, the flip-chip contacts comprising a polymer core surrounded by a lead-free solder material.

2. The semiconductor component as claimed in claim 1, wherein the low-k material has a coefficient of thermal expansion that is lower than the coefficient of thermal expansion of silicon oxide.

3. The semiconductor component as claimed in claim 2, wherein the low-k material has a greater ductility than silicon oxide.

4. The semiconductor component as claimed in claim 1, wherein the low-k material includes a porous silicon dioxide.

5. The semiconductor component as claimed in claim 1, wherein the polymer core comprises a silicone.

6. The semiconductor component as claimed in claim 1, wherein the polymer core comprises a thermoplastic.

7. The semiconductor component as claimed in claim 1, wherein the polymer core comprises an elastomer.

8. The semiconductor component as claimed in claim 1, wherein the polymer core has a ball form.

9. The semiconductor component as claimed in claim 1, wherein the polymer core has a bump form.

10. The semiconductor component as claimed in claim 1, wherein the flip-chip contacts comprise internal connecting elements of the semiconductor component to a wiring substrate and are arranged and fixed on contact pads of a wiring structure on a top side of the wiring substrate.

11. The semiconductor component as claimed in claim 10, wherein an interspace between the semiconductor chip with flip-chip contacts and the top side of the wiring substrate is filled with an underfill material.

12. A method for producing a semiconductor component comprising flip-chip contacts, comprising:

producing a semiconductor chip including a wiring structure including at least one metallization layer with contact areas for the flip-chip contacts and at least one dielectric insulation layer comprising a low-k material having a relative permittivity $\epsilon_r$ lower than the relative permittivity of a silicon oxide; and applying the flip-chip contacts to the contact areas, the flip-chip contacts comprising a polymer core surrounded by a lead-free solder material.

13. The method as claimed in claim 12, wherein the semiconductor chip with the flip-chip contacts is arranged and fixed on contact pads of a wiring structure on a top side of a wiring substrate.

14. The method as claimed in claim 12, wherein an interspace between the semiconductor chip with flip-chip contacts and the top side of the wiring substrate is filled with an underfill material.

15. A semiconductor component, comprising:

a semiconductor chip comprising a wiring structure including at least one metallization layer with contact areas and at least one dielectric insulation layer comprising a low-k material having a relative permittivity $\epsilon_r$ that is lower than the relative permittivity of a silicon oxide; and flip-chip contacts arranged on the contact areas of the metallization layer, the flip-chip contacts comprising a polymer core entirely covered by a layer of a lead-free solder material.

* * * * *